(12) United States Patent
Chen

(10) Patent No.: US 8,558,344 B2
(45) Date of Patent: Oct. 15, 2013

(54) SMALL SIZE AND FULLY INTEGRATED POWER CONVERTER WITH MAGNETICS ON CHIP

(75) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/273,726

(22) Filed: Oct. 14, 2011

(65) Prior Publication Data

US 2013/0056847 A1   Mar. 7, 2013

Related U.S. Application Data

(60) Provisional application No. 61/531,459, filed on Sep. 6, 2011.

(51) Int. Cl.
*H01L 27/08* (2006.01)
*H01L 29/00* (2006.01)
*H01F 7/06* (2006.01)

(52) U.S. Cl.
USPC .... 257/531; 257/528; 257/622; 257/E29.325; 257/E23.011; 29/602.1; 29/605

(58) Field of Classification Search
USPC .......... 257/531, 528, 622, E29.325, E23.011; 29/602.1, 605
See application file for complete search history.

(56) References Cited

U.S. PATENT DOCUMENTS

| | | | |
|---|---|---|---|
| 3,537,022 A | 10/1970 | Regan | |
| 4,027,152 A | 5/1977 | Brown et al. | |
| 4,273,051 A | 6/1981 | Stratton | |
| 4,489,357 A | 12/1984 | Van Ooijen et al. | |
| 4,748,419 A | 5/1988 | Somerville | |
| 5,070,317 A | 12/1991 | Bhagat | |
| 5,095,357 A | 3/1992 | Andoh et al. | |
| 5,097,371 A | 3/1992 | Somers | |
| 5,126,714 A | 6/1992 | Johnson | |
| 5,184,103 A | 2/1993 | Gadreau et al. | |
| 5,321,321 A | 6/1994 | Kurisu | |
| 5,387,551 A | 2/1995 | Mizoguchi et al. | |
| 5,445,922 A | 8/1995 | Maple | |

(Continued)

FOREIGN PATENT DOCUMENTS

EP   0714131   5/1996

OTHER PUBLICATIONS

Wang et al., "Embedded Integrated Inductors with a Single Layer Magnetic Core," Oral presentation, International Workshop on Power Supply on Chip, PwrSOC08, Sep. 23, 2008.

(Continued)

*Primary Examiner* — Long K Tran
(74) *Attorney, Agent, or Firm* — Kenyon & Kenyon LLP

(57) ABSTRACT

An integrated circuit has a semiconductor die provided in a first IC layer and an inductor fabricated on a second IC layer. The inductor may have a winding and a magnetic core, which are oriented to conduct magnetic flux in a direction parallel to a surface of a semiconductor die. The semiconductor die may have active circuit components fabricated in a first layer of the die, provided under the inductor layer. The integrated circuit may include a flux conductor provided on a side of the die opposite the first layer. PCB connections to active elements on the semiconductor die may progress through the inductor layer as necessary.

30 Claims, 8 Drawing Sheets

(56) References Cited

U.S. PATENT DOCUMENTS

| | | |
|---|---|---|
| 5,478,773 A | 12/1995 | Dow et al. |
| 5,502,430 A | 3/1996 | Takahashi et al. |
| 5,548,265 A | 8/1996 | Saito |
| 5,572,179 A | 11/1996 | Ito et al. |
| 5,701,037 A | 12/1997 | Weber et al. |
| 5,877,667 A | 3/1999 | Wollesen |
| 5,952,849 A | 9/1999 | Haigh |
| 6,008,102 A | 12/1999 | Alford et al. |
| 6,054,780 A | 4/2000 | Haigh et al. |
| 6,054,914 A | 4/2000 | Abel et al. |
| 6,087,882 A | 7/2000 | Chen et al. |
| 6,198,374 B1 | 3/2001 | Abel |
| 6,262,600 B1 | 7/2001 | Haigh et al. |
| 6,303,971 B1 | 10/2001 | Rhee |
| 6,356,183 B1 | 3/2002 | Jou |
| 6,873,065 B2 | 3/2005 | Haigh et al. |
| 6,922,080 B2 | 7/2005 | Haigh et al. |
| 7,075,329 B2 | 7/2006 | Chen et al. |
| 7,262,680 B2 | 8/2007 | Wang |
| 7,302,247 B2 | 11/2007 | Dupuis |
| 7,376,212 B2 | 5/2008 | Dupuis |
| 7,421,028 B2 | 9/2008 | Dupuis |
| 7,447,492 B2 | 11/2008 | Dupuis |
| 7,449,987 B2 | 11/2008 | Snyder |
| 7,460,604 B2 | 12/2008 | Dupuis |
| 7,489,526 B2 | 2/2009 | Chen et al. |
| 7,545,059 B2 | 6/2009 | Chen et al. |
| 7,548,440 B2 | 6/2009 | Chen et al. |
| 7,558,080 B2 | 7/2009 | Chen et al. |
| 7,577,223 B2 | 8/2009 | Alfano et al. |
| 7,613,016 B2 | 11/2009 | Chen et al. |
| 7,683,654 B2 | 3/2010 | Chen et al. |
| 7,692,444 B2 | 4/2010 | Chen et al. |
| 7,719,305 B2 | 5/2010 | Chen |
| 7,788,608 B2 | 8/2010 | Huynh et al. |
| 7,859,085 B2 * | 12/2010 | Pagaila et al. ................. 257/621 |
| 7,876,188 B2 | 1/2011 | Tarng et al. |
| 7,920,010 B2 | 4/2011 | Chen, Jr. et al. |
| 7,978,041 B2 | 7/2011 | Bertilsson |
| 7,983,059 B2 | 7/2011 | Chen |
| 8,084,894 B2 | 12/2011 | Chen |
| 8,089,311 B2 | 1/2012 | Chen |
| 2003/0234436 A1 | 12/2003 | Hsu et al. |
| 2005/0088269 A1 | 4/2005 | Hatano |
| 2005/0269657 A1 | 12/2005 | Dupuis |
| 2005/0271148 A1 | 12/2005 | Dupuis |
| 2005/0271149 A1 | 12/2005 | Dupuis |
| 2005/0272378 A1 | 12/2005 | Dupuis |
| 2006/0039224 A1 | 2/2006 | Lotfi et al. |
| 2008/0013635 A1 | 1/2008 | Dupuis |
| 2008/0025450 A1 | 1/2008 | Alfano et al. |
| 2008/0031286 A1 | 2/2008 | Alfano et al. |
| 2008/0119142 A1 | 5/2008 | Dupuis |
| 2008/0180206 A1 | 7/2008 | Fouquet et al. |
| 2008/0238601 A1 | 10/2008 | Das et al. |
| 2008/0260050 A1 | 10/2008 | Dupuis |
| 2008/0267301 A1 | 10/2008 | Alfano et al. |
| 2008/0317106 A1 | 12/2008 | Leung et al. |
| 2009/0017773 A1 | 1/2009 | Dupuis et al. |
| 2009/0027243 A1 | 1/2009 | Leung et al. |
| 2009/0091414 A1 | 4/2009 | Hopper et al. |
| 2009/0213914 A1 | 8/2009 | Dong et al. |
| 2009/0243028 A1 | 10/2009 | Dong et al. |
| 2010/0072570 A1 * | 3/2010 | Pagaila et al. ................. 257/528 |
| 2011/0255208 A1 | 10/2011 | Petruska et al. |

OTHER PUBLICATIONS

Wright et al., "Analysis of Integrated Solenoid Inductor With Closed Magnetic Core", IEEE Transactions on Magnetics, 46(6):2387-2390, Jun. 2010.

Lazarczyk, "Comparison of Fields Emitted From High Frequency Silicon-Integrated, Microfabricated Inductors". Power Electronics and Applications, 2009. EPE '09.

PCT International Search Report and Written Opinion from PCT/US2012/046458, mailed on Sep. 18, 2012.

International Search Report and Written Opinion for International Application No. PCT/US2012/045069, report dated Sep. 12, 2012.

* cited by examiner

300

400

500

600

700

800

900

900

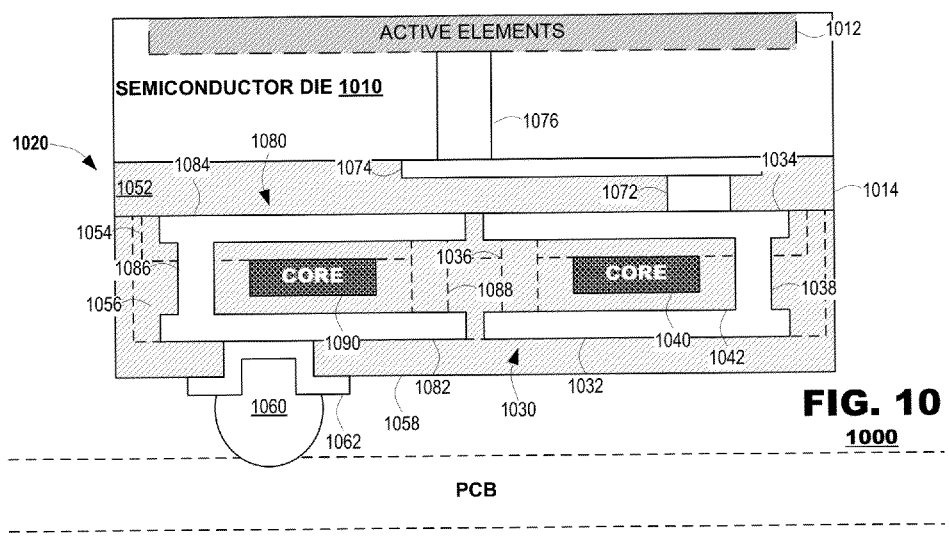

SMALL SIZE AND FULLY INTEGRATED POWER CONVERTER WITH MAGNETICS ON CHIP

PRIORITY CLAIM

This application benefits from priority of provisional application Ser. No. 61/531,459, filed Sep. 6, 2011, the disclosure of which is incorporated herein.

BACKGROUND

The subject matter of this application is directed to magnetic circuits implemented on an integrated circuit for providing functionality derived from magnetic circuits, e.g., applications for resistor-inductor-capacitor (commonly, "RLC") circuits.

Traditional switched power converters require discrete inductors that are large and expensive. For many portable applications such as handsets, size and cost are critical. For a single battery system, there are usually many voltage domains so that power is optimized for each voltage domain. Such systems require efficient power conversion from the voltage of the source battery to the other voltage domains to optimize power consumption and thus extend battery life. Linear regulators can be used without the need of inductors, but they are very inefficient, especially for large step down ratios. It is desired to have switched converters for step down and step up conversions for efficient power transfer, however, discrete inductors required for the switching power converters are large and heavy, not desirable for portable applications. Also, for portable applications, it is desired that the converters have good load transient response and thus fast switching frequency. Discrete inductors are disadvantageous for such applications because they become lossy at high frequencies. It is desired to have inductors that are small, light weight and have good high frequency efficiency.

Air core inductors have limitations due, in part, to high resistance and low inductance. For example, power may be radiated back to the power plant or ground plane which may affect the electromagnetic interference (EMI). Designers must concentrate a great deal of effort to using high frequency signals and switching to mitigate the effects of EMI. EMI is proportional to frequency. Printed circuit board (PCB) designers must be concerned with EMI effects due to high currents that are generated. Radiated power is also a problem as it may interfere with other circuits that are not connected to the PCB.

In addition, when manufactured within an integrated circuit die ("IC"), air core inductors are not efficient with small inductance and high resistance, which causes users to limit power available due to thermal limits for packaging. On chip power dissipation limits the power that may be provided to an on-chip inductor. These effects can limit the applications for which air core IC inductors can be used.

The addition of magnetic cores to inductors increases winding inductance and power conversion efficiency resulting in lower inductor peak current, reduced power consumption and also reduced interference to other components. It can lead to use of lower switching frequencies among driving signals. Further, magnetic flux is more constrained by a magnetic core which limits EMI corruption to circuit components that would be co-located with the magnetic core inductor. Increased inductance per unit area also leads to high energy density and device miniaturization.

Magnetic core-based inductors have been used on integrated circuit dies with only limited success. Usually planar spiral coils are used with the addition of a single magnetic layer above or below them. The inductance enhancement from such implementation over the air core spirals is very limited, at most 100%. To achieve the inductance needed, it occupies a large die area. Its size mismatch with power switching circuits makes the integration not economically viable. Magnetic core-based inductors tend to occupy large areas when laid out on integrated circuit die, which interferes with design attempts to make smaller chips. Such layout issues become exacerbated when designers attempt to find configurations that allow such integrated circuits to be mounted on larger components, for example, a printed circuit board (PCB). No known inductor configuration adequately meets these design needs.

BRIEF DESCRIPTION OF THE DRAWINGS

FIG. 10 is a sectional view of an integrated circuit according to another embodiment of the present invention.

DETAILED DESCRIPTION

Embodiments of the present invention may provide for an integrated circuit having a semiconductor die provided in a first IC layer and an inductor fabricated on a second IC layer. The inductor may have a winding and a magnetic core, which are oriented to conduct magnetic flux in a direction parallel to a surface of a semiconductor die. The semiconductor die may have active circuit components fabricated in a first layer of the die, provided under the inductor layer. The integrated circuit may include a flux conductor provided on a side of the die opposite the first layer. The integrated circuit also may include a plurality of chip connectors, such as solder balls, to mount the integrated circuit to a larger structure, for example a PCB, in a chip scale package (CSP) configuration to minimize PCB area needed for the devices, thus make them more compact and light weight. PCB connections to active elements on the semiconductor die may progress through the inductor layer as necessary.

The magnetic core may be a solid bar with the winding provided around it. Alternatively, the magnetic core may be formed from a plurality of magnetic bars separated by dielectric spacers with the winding provided around the collection of bars. In a further embodiment, the core may be provided as a pair of cores with the winding provided around the first core in a first sub-winding then extending to and winding around the second core.

A single bar core has the most area efficiency as a pair of cores on the same surface will occupy larger area, but there is concern on EMI due to leakage flux with single bar core. A magnetic layer on the opposite of the die surface where the inductors are fabricated can help to close the flux loop without the need for extra surface area. This added magnetic layer needs not to be patterned so it can simply be a ferrite loaded epoxy layer or other films with magnetic permeability larger than one deposited or coated.

In another embodiment, an integrated circuit may have a semiconductor die provided in a first IC layer and an inductor fabricated on a second IC layer. The inductor may have a winding and a magnetic core, which are oriented to conduct magnetic flux in a direction parallel to a surface of a semiconductor die. The semiconductor die may have active circuit components fabricated in a layer of the die which provided on an opposite side from a side on which the inductor layer is mounted. The integrated circuit may include a plurality of chip connectors, such as solder balls, to mount the integrated circuit to a larger structure, for example a PCB, in a chip scale package (CSP) configuration to minimize PCB area needed for the devices, thus make them more compact and light weight.

Figure 1:
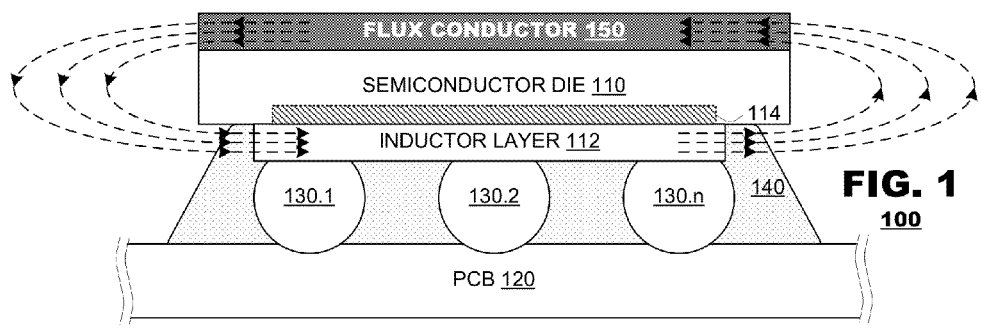
FIG. 1 is a schematic view of an integrated circuit according to an embodiment of the present invention.

FIG. 1 illustrates an integrated circuit 100 according to an embodiment of the present invention. The integrated circuit 100 may include a semiconductor die 110 having an inductor layer 112 formed adjacent to a face of the semiconductor die 110 on which active devices are fabricated (shown as layer 114). The integrated circuit 100 may be mounted on a PCB 120 via an interconnect such as a plurality of solder balls 130.1-130.n (referred generally as interconnect 130). The interconnect 130 may be covered by a protective encapsulant 140 that can enhance thermal conduction between the die 110 and PCB 120. The integrated circuit 100 may include a flux conductor 150 provided on a second surface of the die 110 away from the active layer 114. The flux conductor 150 may be provided as a film of magnetic material sputtered onto the second surface of the die 110.

Inductor(s) of the inductor layer 112 and component(s) of the active device layer 114 each will be configured for specific applications of the integrated circuit. The semiconductor die 110 may have dimensions sized to accommodate the dimensions of the inductor layer 112 and active device layer 114. Interconnect structures 130.1-130.n may be provided within a spatial area defined by a perimeter of the semiconductor die 110. Thus, the interconnect 130 need not expand the "footprint" of the die 110 when the die 110 is mounted on the PCB 120.

FIG. 1 is a schematic view of the components of the integrated circuit 100. Relationships between the die 110, interconnect 130 and the various layers 112, 114 are not shown to scale.

Figure 2:
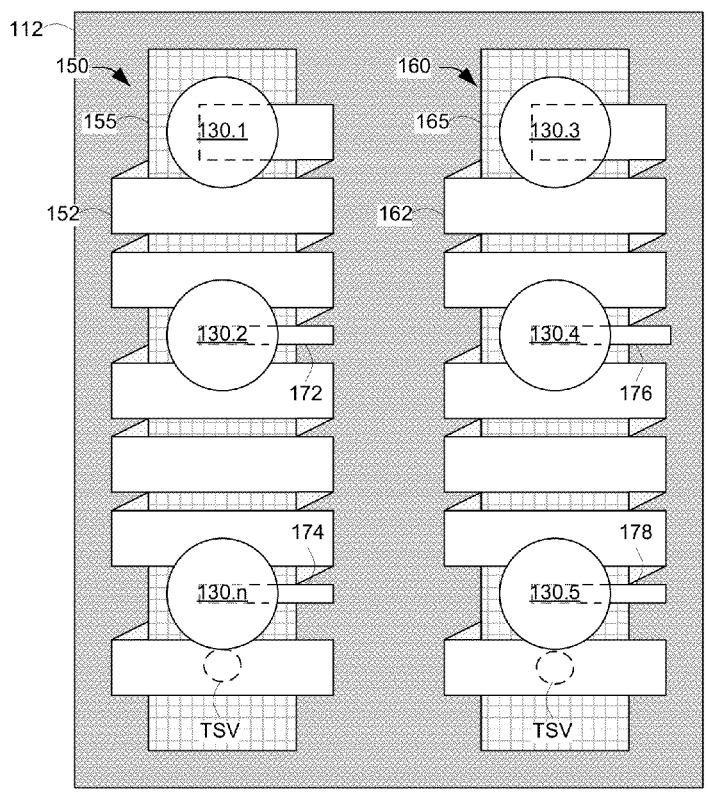
FIG. 2 illustrates an exemplary inductor layer of an integrated circuit according to an embodiment of the present invention.

FIG. 2 illustrates a view of an exemplary inductor layer 112, viewed from a PCB layer. The inductor layer 112 may include a pair of inductors 150, 160 each having a winding 152, 162 provided in a spiral around a respective magnetic core 155, 165. Each winding is shown having a solder ball 130.1, 130.3 providing a first electrical connections for the inductor winding 152, 162 and a through silicon via (TSV) representing an electrical connection between the respective winding 152, 162 and a component of the active layer.

The inductor layer 112 is illustrated as including traces 172-178 connected to other solder balls 130.2 and 130.4-130.n for connection to circuit components of the active layer (not shown). These traces may penetrate through the inductor layer 112 without electrically engaging with either the winding 150 or the magnetic core 152. The traces may carry supply voltages (e.g., VDD or ground) or information signals for components of the active layer.

The example of FIG. 2 illustrates a pair of inductors in the inductor layer 112. Of course, the inductor layer may have fewer inductors (one) or more inductors as design needs require.

The example of FIG. 2 illustrates the inductor has having a linear magnetic core 152, 162. This is but one available configuration. Other configurations are provided in the ensuing discussion, including multi-segment cores, toroidal cores and cores with voids.

Moreover, the example of FIG. 2 illustrates solder ball connections 130.1, 130.3 to provide external contacts to the inductors—to connect the inductor to the PCB. Again, this is but an example. Depending on circuit requirements, inductors may be connected solely to components of the active layer instead of to the PCB. Alternatively, one inductor may be connected solely to the active layer and another inductor may be connected solely to the PCB as design needs dictate.

Figure 3:
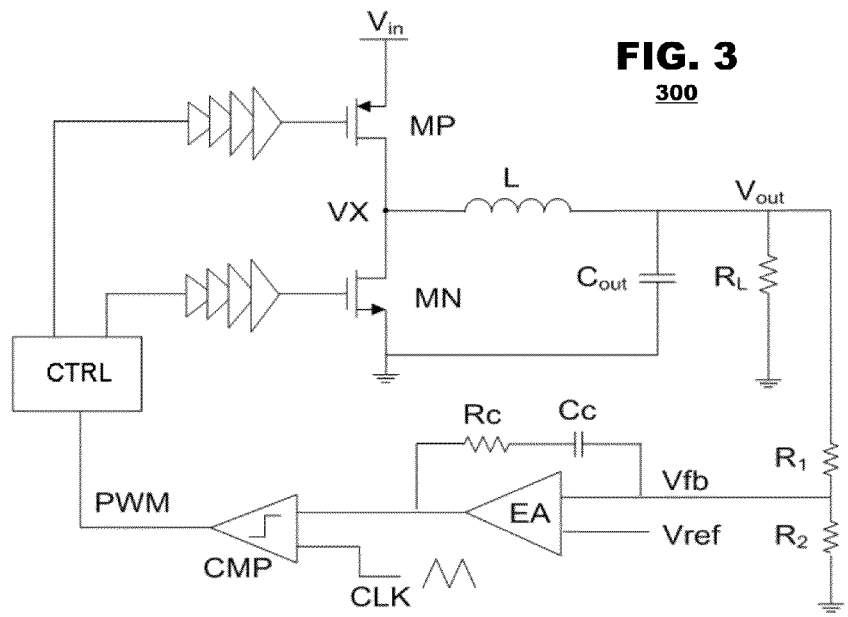
FIG. 3 is a diagram of an exemplary circuit that may find application with an integrated circuit according to an embodiment of the present invention.

FIG. 3 illustrates an exemplary circuit 300 suitable for application with the inductors of the present invention. The circuit as illustrated is a buck converter but, of course, different circuit systems may find application with the present invention. The circuit of FIG. 3 includes switching transistors $M_P$ and $M_N$, capacitors $C_{OUT}$ and $C_c$, an inductor L, resistors $R_C$, $R_L$, $R_1$ and $R_2$, various amplifiers, a comparator CMP and a controller CTRL. When the circuit 300 is manufactured as an integrated circuit according to embodiments of the present invention, the inductor L may be fabricated in an inductor layer 112 (FIG. 1) and the remaining components may be fabricated in an active layer 114 (also FIG. 1).

Figure 4:
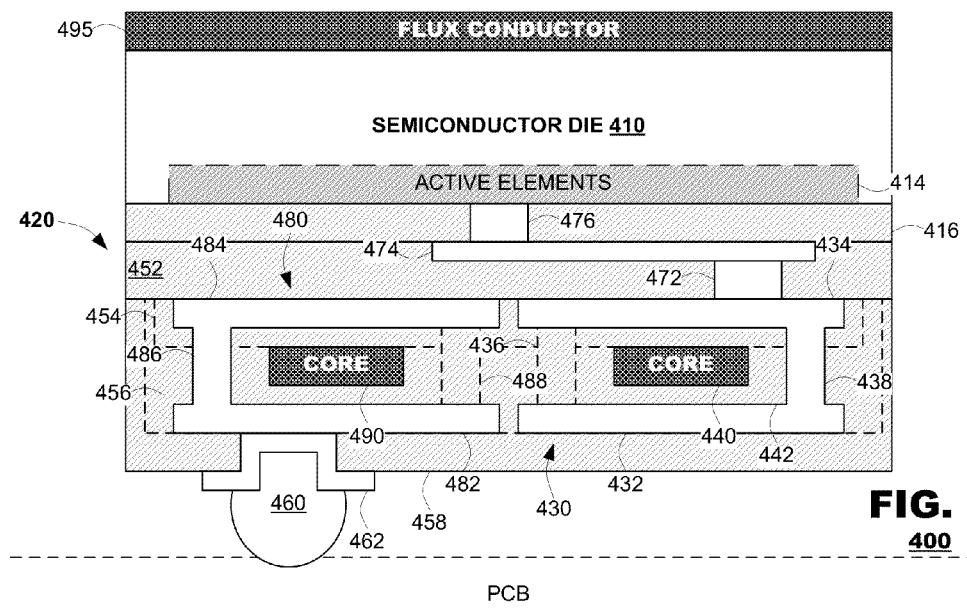
FIG. 4 is a sectional view of an integrated circuit according to an embodiment of the present invention.

FIG. 4 illustrates a sectional view of the integrated circuit of FIGS. 1 and 2. FIG. 4 is a schematic illustration only; components are not drawn to scale. As illustrated, the integrated circuit 400 may include a semiconductor die 410 having a layer for active elements 414 and a dielectric layer 416 separating an inductor layer 420 from the die 410.

The inductor layer 420 may include an inductor winding 430 having a plurality of spiral turns, each turn formed by a pair of traces 432, 434 formed on two parallel sub-layers of the inductor layer 420, and a pair of winding posts 436, 438 extending upwardly through the sub-layers to connect to the traces 432, 434. When the inductor layer 420 is manufactured in an integrated circuit, the winding 430 may include several sets of posts 436, 438 and traces 432, 434 arranged in a multi-turn spiral as shown in FIG. 2. The inductor may include a magnetic core 440 provided in a center area formed by the inductor spiral. Dielectric material 442 may be provided within the inductor layer 420 to electrically isolate all turns of the winding 430 from the magnetic core 440.

The inductor may be encased in various layers of dielectric insulating material 452-458 to prevent electrical engagement between the inductor winding 430 and any other circuit component.

Since FIG. 2 illustrates a pair of inductors, FIG. 4 illustrates structures 482-488 of a second winding 480 and a second magnetic core 490. FIG. 4 also illustrates connection between a winding 480 and an external interconnect formed by a solder ball 460 and an under bump metallization layer 462. Again, such interconnect structures are appropriate only if design requirements call for electrical connection between the winding 480 and a component external to the integrated circuit such as on a PCB.

FIG. 4 further illustrates a connection 470 formed between a winding 430 and the active elements layer 414 formed by a post 472, a metal trace 474 and a via 476. The post 472 may be connected to a trace 434 of the winding 430 and may extend through dielectric layer 452 toward the die 410. The trace 474 may provide an electrical path between the inductor winding 430 and a via 476. The via 476 may extend through the dielectric layer 416 to an appropriate position of the active element layer 414. Thus, the connection 470 may provide electrical connection between the inductor and a component in the active element layer 414.

FIG. 4 illustrates a layer of a flux conductor 495 provided on a second surface of the die 410 away from the active elements 414. The flux conductor 495 may be fabricated from the same material as used for the magnetic core(s) 440, 490.

The orientation of the magnetic core 440 and winding 430 allows the inductors to be manufactured according to conventional integrated circuit manufacturing techniques. Using semiconductor masks and photolithography, the windings 430, 480 dielectrics 442 and 454-458 and magnetic cores 440, 490 may be built up in multiple layers of material depositions. In one example, winding traces 434, 484 that form a rear surface of the windings 430, 480 may be built up in a first stage of manufacture on top of dielectrics 452 that isolate the inductors from the die 410 and from any die-oriented interconnect traces 474-474. Thereafter, a dielectric layer 454 may be applied to fill in interstitial regions between the traces 434, 484 and also to cover them. In another stage, materials representing the magnetic cores 440, 490 may be laid upon the first dielectric layer 452. Additionally, materials representing the winding posts 436, 438, 486, 488 may be built up from appropriate connection points of the rear surface traces 434, 484 to build lateral sides of the respective windings 430, 480. An additional layer 456 of dielectric material may be applied to encase the magnetic cores 440, 490 and winding posts 436, 438, 486, 488 in the dielectric. Further metallic material may be deposited on the dielectric-covered front side of the magnetic cores 440, 490 to build up front traces 432, 484 to complete the windings 430, 480. Thereafter a final layer 458 of dielectric may be deposited on the windings 430, 480 with accommodation made for any interconnect structures 460, 462 that are needed.

In an embodiment, the dielectric materials may be high dielectric breakdown materials such as polyimide, silicon dioxide, silicon nitride and the like. The magnetic core layers 440, 490 and flux conductor layer 495 can be made of materials of high permeability such as CoTaZr (cobalt tantalum zirconium) NiFe (nickel ferrite) and FeCo (ferrite cobalt)-based alloys. The windings and metal interconnect structures may be formed of an appropriate conductive metal such as gold or copper.

Figure 5:
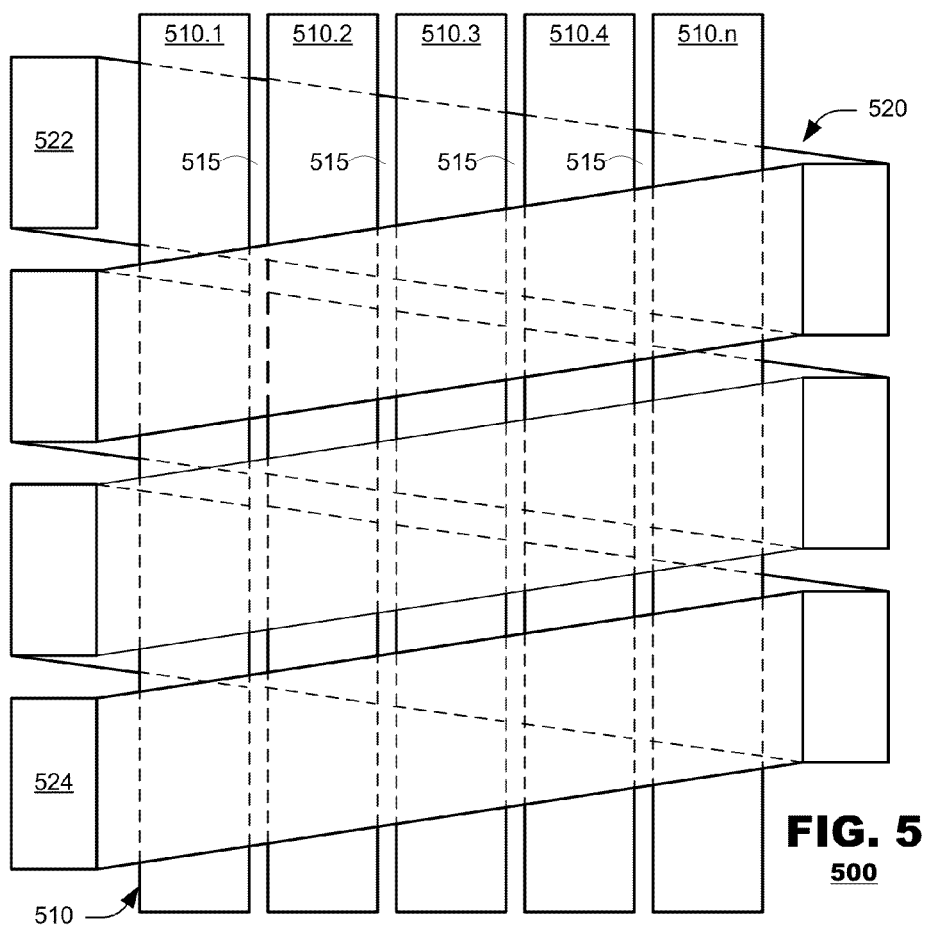
FIGS. 5-9 illustrates configurations of inductors and cores according to various embodiments of the present invention.

FIG. 5 illustrates a configuration of an on-chip inductor with a magnetic core according to another embodiment of the present invention. In this configuration, a core 510 is provided in a segmented, linear configuration. The magnetic core 510 may be formed as a plurality of core bars 510.1-510.n having a elongated direction parallel to the direction of magnetic flux that will be induced by currents flowing through the winding 520. Voids 515 may occur between the magnetic bars 510.1-510.n and may be filled by a dielectric. The voids may be as narrow as practical (say, 1-10 micrometers) to minimize the reduction of the total core cross-sectional area and yet isolate each of the bars from its neighbor. The voids 515 may alter the shape anisotropy of the magnetic core 510 and provide enhanced permeability. The voids 515 also may limit the generation and transmission of eddy currents in the magnetic core 510 due to magnetic flux.

The winding 520 may spiral around the entire core structure, including all bars 510.1-510.n and voids. It may have input and output terminals 522, 524 to connect the winding to other circuit structures.

The inductor may be mounted within a semiconductor substrate such that conductivity of magnetic flux carried by the core extends in a direction parallel to a surface of the substrate.

Figure 6:
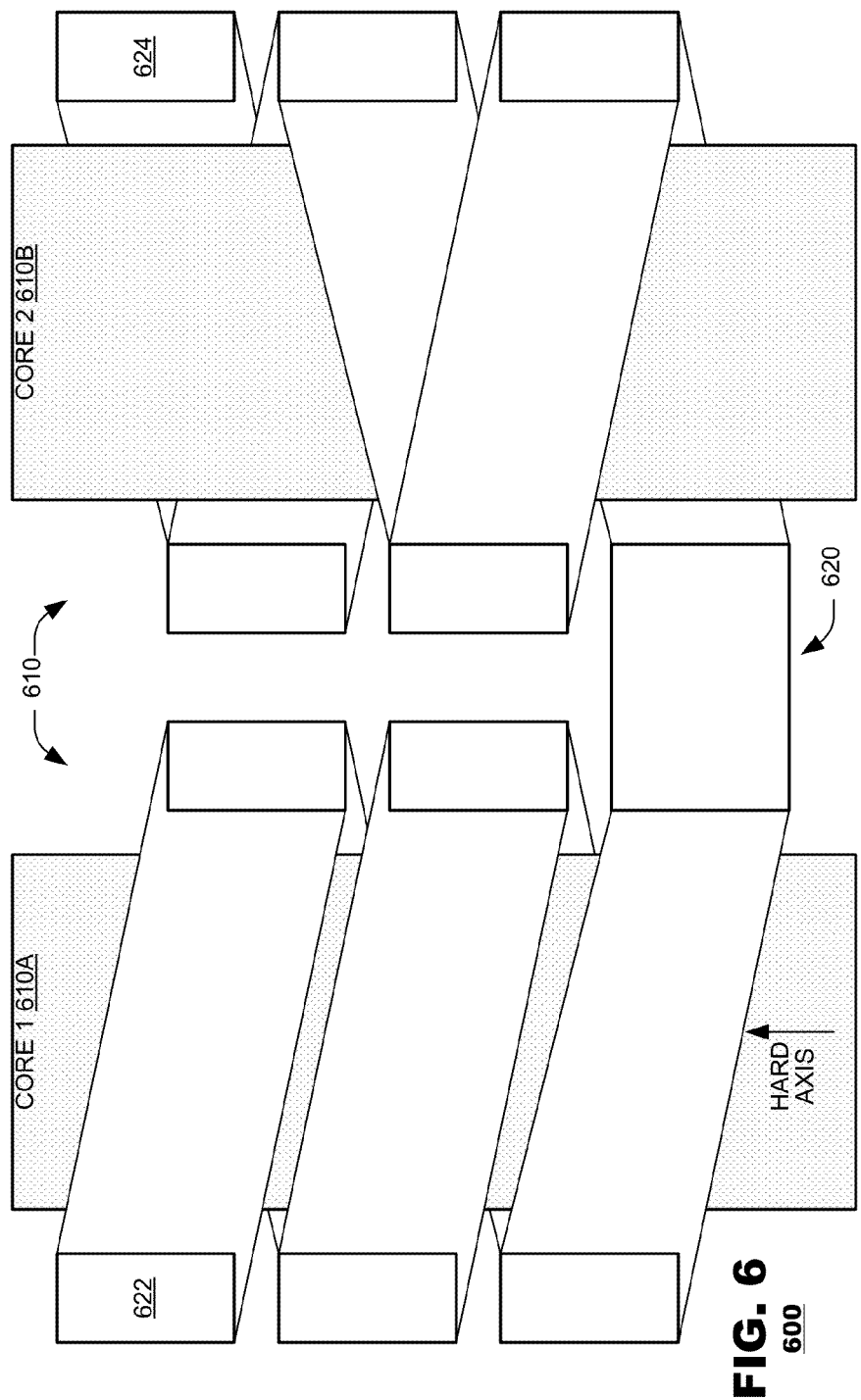

FIG. 6 illustrates another configuration of an on-chip inductor according to an embodiment of the present invention. In this embodiment, the inductor 600 includes a multi-element core 610 and a winding 620. The core 610 is provided as two linear segments 610A and 610B, each made of a magnetic material.

The winding 620 may extend between input and output terminals 622, 624. The winding 620 may spiral around the first core element 610A, then extend to and spiral around the second core element 610B. The orientation of the winding 620 may be reversed between the first and second core elements 610A, 610B to reduce flux leakage from the inductor 600. In this manner, a driving current may induce flux in the two core elements having opposite direction from each other. This configuration helps provide a flux return path, and reduce flux leakage into surrounding components and EMI radiation. The inductor 620 may be mounted within a semiconductor substrate such that conductivity of magnetic flux carried by the core extends in a direction parallel to a surface of the substrate.

During manufacture, the hard axis of the magnetic core material may be controlled to align to the direction of magnetic flux that will be generated by the inductor during operation. Aligning the hard axis with the direction of flux is expected to reduce switching losses that may occur during operation of the inductor.

The embodiment of FIG. 6 may be used in IC applications that do not employ flux conductors on rear surfaces of a semiconductor die.

Figure 7:
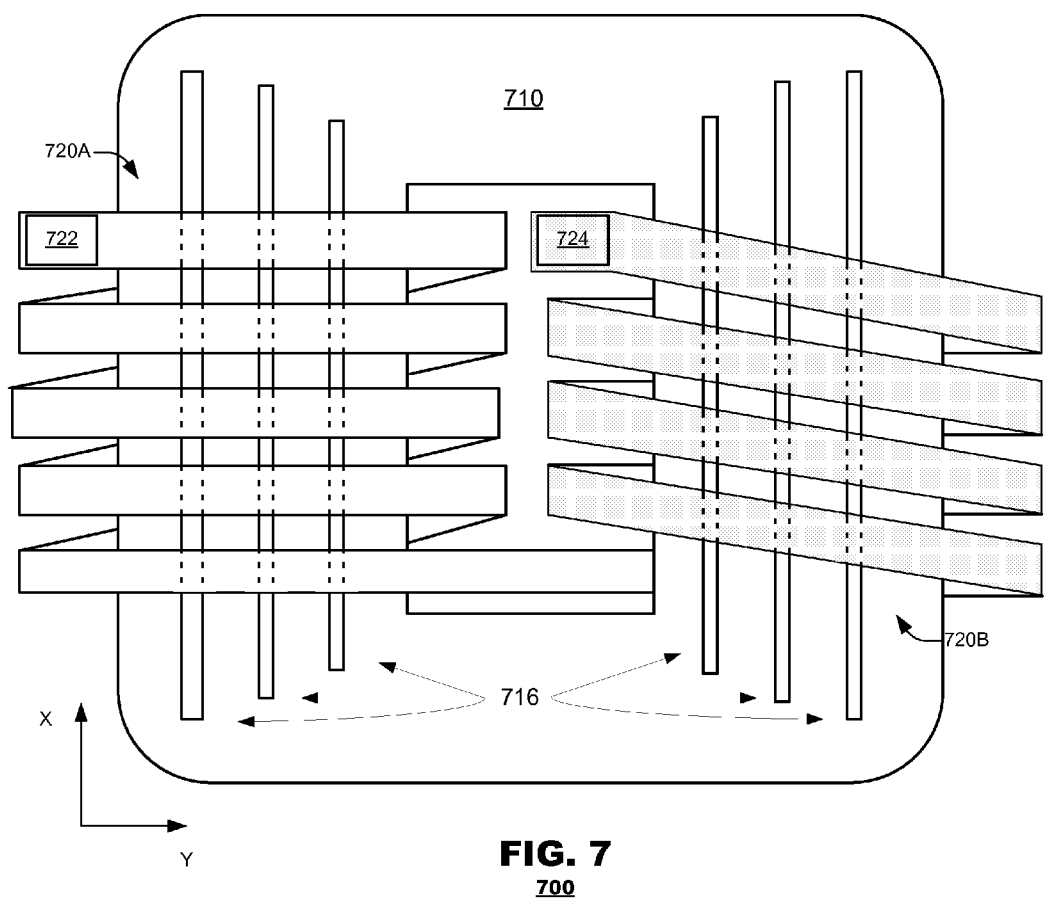

FIG. 7 illustrates an on-chip inductor 700 with a magnetic core according to another embodiment of the present invention. The inductor 700 may include a magnetic core 710 and a winding 720. The winding 720 may be provided as a pair of sub-windings 720A, 720B extending between input and output terminals 722, 724. The magnetic core 710 may formed as a closed loop extending between centers of each of the sub-windings 720A, 720B. Magnetic flux may travel circularly through the ring-shaped core. During manufacture, the anisotropic direction may be controlled such that the easy axis is along the Y direction and hard axis is along the X direction. Flux generated by the windings may travel easily with the core along the hard axis (X direction).

The flux traveling along the easy axis (Y-direction) can be lossy. Thus, flux may tend to escape through the top of the core instead of following the shape of the magnetic core 710 along the Y axis. In this sense, the embodiment may exhibit more losses than the embodiment of FIG. 6.

The inductor may be mounted within a semiconductor substrate such that conductivity of magnetic flux carried by the core extends in a direction parallel to a surface of the substrate.

In a first embodiment, the magnetic core 710 may be a solid magnetic core. In another embodiment, the magnetic core may have voids 716 provided in a volume formed by the sub-windings 720A, 720B. The voids 716 may be filled with insulating material or a dielectric material that may change anisotropy and enhance magnetic permeability.

The embodiment of FIG. 7 may be used in IC applications that do not employ flux conductors on rear surfaces of a semiconductor die.

Figure 8:
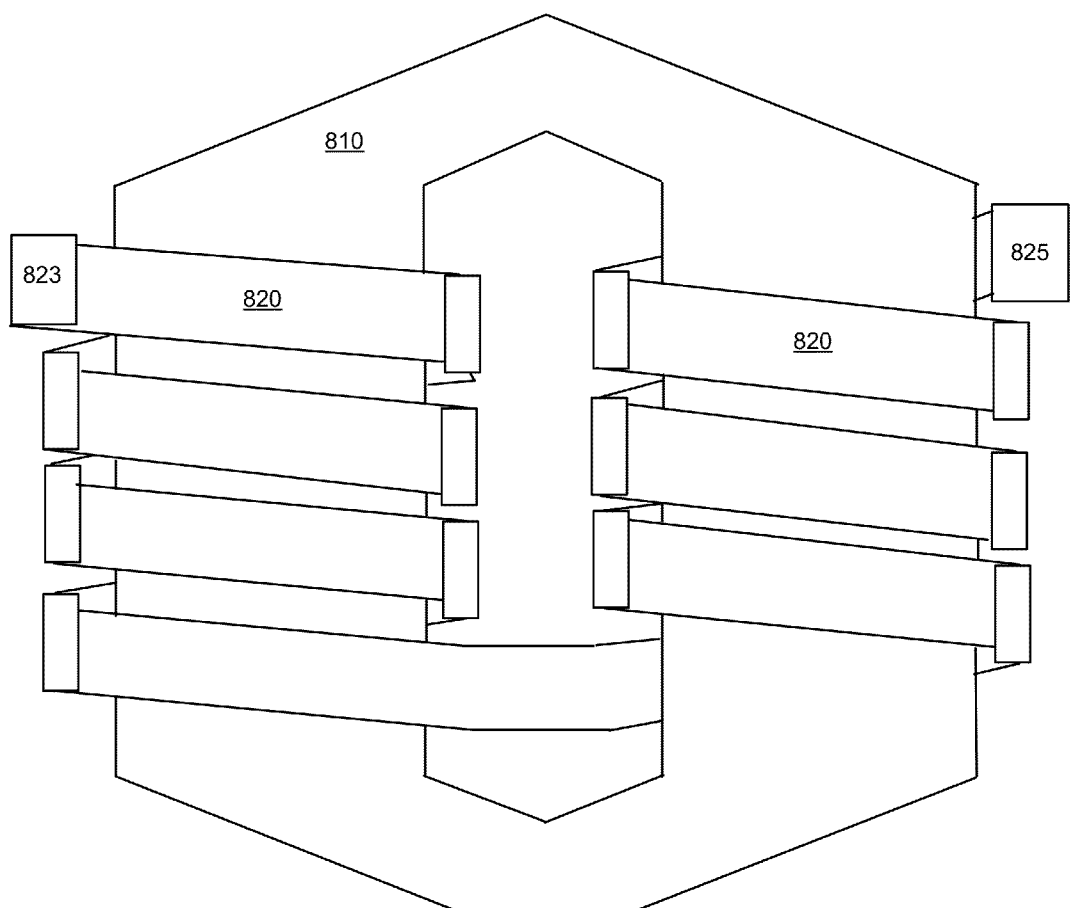

FIG. 8 illustrates another configuration of an inductor 800 according to an embodiment of the present invention. This embodiment is similar to the FIG. 7 embodiment but the shape of the core is provided as a generally hexagonal shape rather than a rectangular shape as illustrated in FIG. 7. The configuration of the core may be modified to include any number of closed-loop shapes including circular configurations, octagonal configurations and the like. The embodiment of FIG. 8 may be used in IC applications that do not employ flux conductors on rear surfaces of a semiconductor die.

Figure 9A:
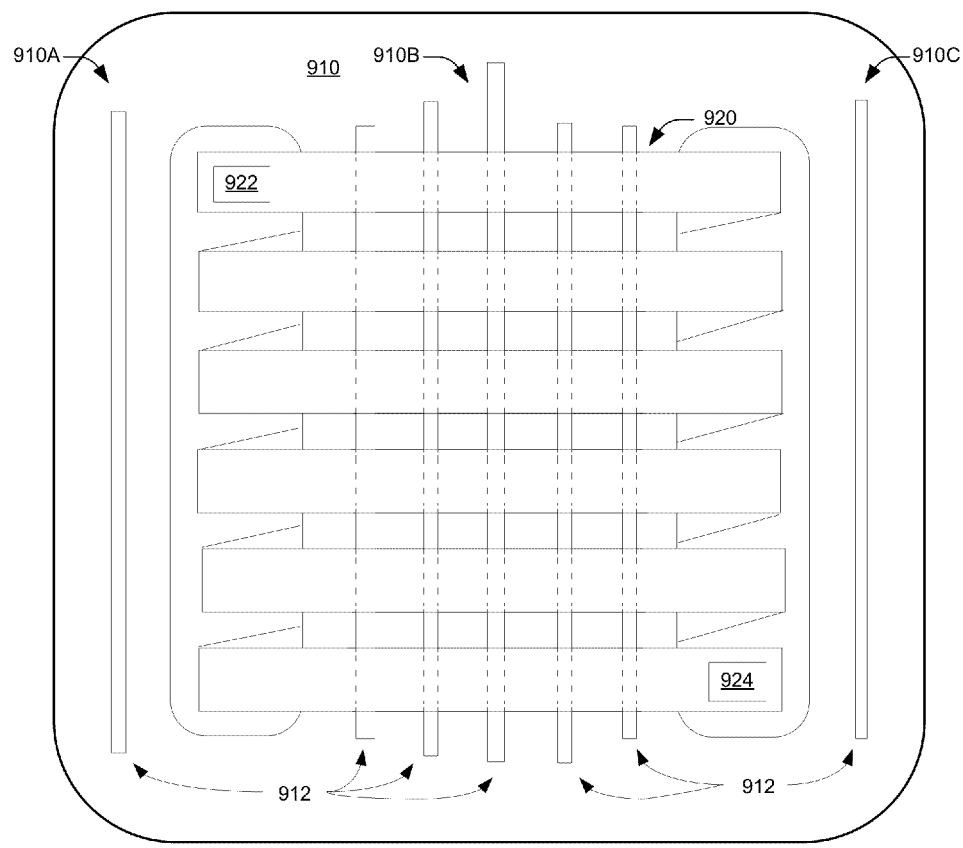
Figure 9B:
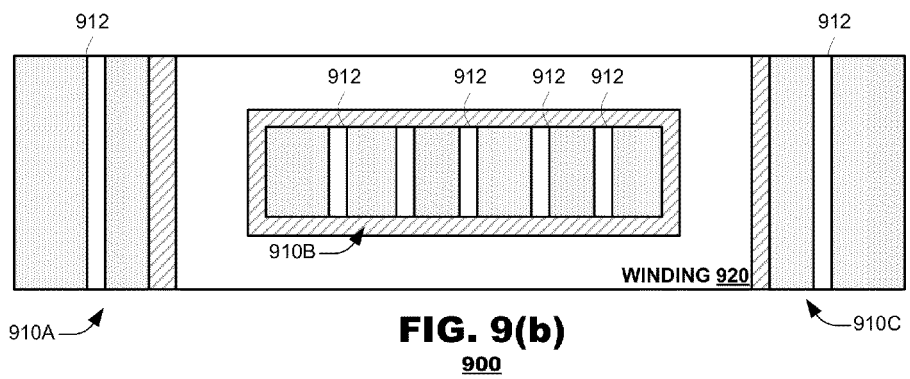

FIG. 9 illustrates another configuration of an inductor 900 according to an embodiment of the present invention. The inductor 900 may include a magnetic core 910 and a winding 920. In this embodiment, the core may be provided as multi-element core in which the winding 920 spirals around a center core element 910B, and edge core elements 910A, 910C may be provided external to the winding. Each of the core elements 910A, 910B, 910C may be provided as solid core elements (not shown) or may be provided with voids 912. The inductor may be mounted within a semiconductor substrate such that conductivity of magnetic flux carried by the core extends in a direction parallel to a surface of the substrate.

During operation, flux may be developed in the center core element 910B in response to a driving current. The edge core elements 910A, 910C may develop a return path for the flux, which helps reduce flux leakage outside the core.

The embodiment of FIG. 9 may be used in IC applications that do not employ flux conductors on rear surfaces of a semiconductor die.

FIG. 10 illustrates layout of an integrated circuit with an integrated inductor layer according to another embodiment of the present invention. In the FIG. 10 embodiment, active elements are provided on a face of a semiconductor die facing away from the inductor layer. FIG. 10 is a schematic illustration only; components are not drawn to scale.

As illustrated, the integrated circuit 1000 may include a semiconductor die 1010 having a layer for active elements 1012 on a first face of the die 1010 and a dielectric layer 1014 provided on a second face of the die 1010. The inductor assembly 1020 may be provided on the second face of the die 1010 and may include inductor winding(s) 1030, 1080 having a plurality of spiral turns. The integrated circuit may include a variety of through silicon vias (TSVs) to facilitate electrical connection between inductor(s) and components of the active element layer 1012 as circuit needs require.

With the inductor assembly 1020, windings 1030 may include a plurality of turns formed by traces 1032, 1034 formed on two parallel layers of the inductor assembly 1020 and winding posts 1036, 1038 extending upwardly between the layers to connect to the traces 1032, 1034. Inductors further may include a magnetic core 1040 provided in a center of the windings and a dielectric material 1042 electrically isolating all turns of the winding 1030 from the magnetic core 1040. FIG. 10 also illustrates structures 1082-1088 of a second winding 1080 and a second magnetic core 1090.

The inductor assembly 1020 may be encased in various layers of dielectric insulating material 1052-1058 to prevent electrical engagement between the inductor winding 1030 and any other circuit component.

FIG. 10 also illustrates connection between a winding 1080 and an external interconnect formed by a solder ball 1060 and an under bump metallization layer 1062. Again, such interconnect structures are appropriate only if design requirements call for electrical connection between the inductor 1020 and a component external to the integrated circuit such as on a PCB.

FIG. 10 further illustrates a connection 1070 formed between a winding 1030 and the active elements layer 1012 formed by a post 1072 extending through dielectric layer 1052 toward the die 1010 and a metal trace 1074 providing routing between the inductor winding 1030 to a through silicon via (TSV) 1076. The TSV 1076 may extend through the semiconductor die 1010 to an appropriate position of the active element layer 1012. A metal may occupy the TSV 1070 to provide electrical connectivity between the winding 1030 and a component of the active elements layer 1012.

The orientation of the magnetic core 1040 and winding 1030 allows the inductors to be manufactured according to conventional integrated circuit manufacturing techniques. Using semiconductor masks and photolithography, the windings 1030, 1080 dielectrics 1042 and 1054-1058 and magnetic cores 1040, 1090 may be built up in multiple layers of material depositions. In one example, winding traces 1034, 1084 that form a rear surface of the windings 1030, 1080 may be built up in a first stage of manufacture on top of dielectrics 1052 that isolate the inductors from the die 1010 and from any die-oriented interconnect traces 1074-1074. Application of a dielectric layer 1054 may occur in a subsequent manufacturing stage to fill in interstitial regions between the traces 1034, 1084 and also to cover them. In another stage, materials representing the magnetic cores 1040, 1090 may be laid upon the first dielectric layer 1052. Additionally, materials representing the winding posts 1036, 1038, 1086, 1088 may be built up from appropriate connection points of the rear surface traces 1034, 1084 to build lateral sides of the respective windings 1030, 1080. An additional layer 1056 of dielectric material may be applied to encase the magnetic cores 1040, 1090 and winding posts 1036, 1038, 1086, 1088. Further, metallic material may be deposited on the dielectric-covered front side of the magnetic cores 1040, 1090 to build up front traces 1032, 1084 to complete the windings 1030, 1080. Thereafter a final layer 1058 of dielectric may be deposited on the windings 1030, 1080 with accommodation made for any interconnect structures 1050, 1052 that are needed.

In an embodiment, the dielectric materials may be high dielectric breakdown materials such as polyimide, silicon dioxide, silicon nitride and the like. The magnetic core layers 1040, 1090 and flux conductor layer 1095 can be made of materials of high permeability such as CoTaZr (cobalt tantalum zirconium) NiFe (nickel ferrite) and FeCo (ferrite cobalt)-based alloys. Finally, the windings and metal interconnect structures may be formed of an appropriate conductive metal such as gold or copper.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. An integrated circuit, comprising:
   a semiconductor die having active circuit components fabricated in a first surface thereof,
   an inductor layer provided over the first surface of the semiconductor die, comprising an inductor with a magnetic core, a winding of the inductor oriented to conduct flux in a direction generally parallel to the first surface of the semiconductor die, and
   a flux conductor provided on a second surface of the semiconductor die opposite to the first surface.

2. The integrated circuit of claim 1, wherein the integrated circuit has a package configuration for chip scale packaging.

3. The integrated circuit of claim 1, wherein the integrated circuit has a package configuration size to match a larger area between an area of the active circuit components and the inductor.

4. The integrated circuit of claim 1, further comprising an encapsulant covering the active circuit components and inductor.

5. The integrated circuit of claim 1, further comprising a connector coupling a terminal of the inductor to an active circuit component on the first surface of the semiconductor die.

6. The integrated circuit of claim 1, further comprising a connector extending from a package of the integrated circuit, the connector coupled to a terminal of the inductor.

7. The integrated circuit of claim 6, further comprising a second connector extending from a package of the integrated circuit, the connector coupled to a conductor that passes through the inductor layer and connects to an active circuit component on the first surface of the semiconductor die.

8. The integrated circuit of claim 1, wherein the magnetic core is a solid core.

9. The integrated circuit of claim 1, wherein the magnetic core is multi-segment core having a dielectric material provided in voids between adjacent segments.

10. The integrated circuit of claim 1, wherein the inductor layer includes at least two inductors.

11. The integrated circuit of claim 1, wherein the inductor further comprises a second magnetic core generally aligned with the first magnetic core and the inductor winding is provided as separate spirals around each of the magnetic cores, each spiral generating flux in an opposite direction to the other spiral in response to a common signal through the winding.

12. An integrated circuit, comprising:
  a semiconductor die having active circuit components fabricated in a first surface thereof;
  an inductor layer provided over a first surface of the semiconductor die, the inductor layer comprising an inductor winding provided around a magnetic core, the winding of the inductor oriented to conduct flux in a direction generally parallel to the first surface of the semiconductor die, wherein the inductor is electrically connected to at least one active circuit component; and
  a flux conductor provided on a second surface of the semiconductor die opposite to the first surface.

13. The integrated circuit of claim 12, wherein the integrated circuit has a package configuration for chip scale packaging.

14. The integrated circuit of claim 12, wherein the magnetic core and flux conductor are made of a common material.

15. The integrated circuit of claim 12, further comprising a connector extending from a package of the integrated circuit, the connector coupled to a terminal of the inductor.

16. The integrated circuit of claim 15, further comprising a second connector extending from a package of the integrated circuit, the connector coupled to a conductor that passes through the inductor layer and connects to an active circuit component on the first surface of the semiconductor die.

17. The integrated circuit of claim 12, wherein the magnetic core is a solid core.

18. The integrated circuit of claim 12, wherein the magnetic core is multi-segment core having a dielectric material provided in voids between adjacent segments.

19. The integrated circuit of claim 12, wherein the inductor layer includes at least two inductors.

20. The integrated circuit of claim 12, wherein the inductor further comprises a second magnetic core generally aligned with the first magnetic core and the inductor winding is provided as separate spirals around each of the magnetic cores, each spiral generating flux in an opposite direction to the other spiral in response to a common signal through the winding.

21. An integrated circuit, comprising:
  a semiconductor die having active circuit components fabricated in a first surface thereon and having at least one through silicon via (TSV); and
  an inductor layer provided over a second surface of the semiconductor die opposite to the first surface, the inductor layer comprising an inductor winding provided around a magnetic core, the winding of the inductor oriented to conduct flux in a direction generally parallel to the first surface of the semiconductor die, wherein the inductor is electrically connected to at least one active circuit component in an electrical path that extends through the TSV; and
  a flux conductor provided on the second surface of the semiconductor die opposite to the first surface.

22. The integrated circuit of claim 21, wherein the integrated circuit has a package configuration for chip scale packaging.

23. The integrated circuit of claim 21, further comprising a connector extending from a package of the integrated circuit, the connector coupled to a terminal of the inductor.

24. The integrated circuit of claim 21, wherein the magnetic core is a solid core.

25. The integrated circuit of claim 21, wherein the magnetic core is multi-segment core having a dielectric material provided in voids between adjacent segments.

26. The integrated circuit of claim 21, wherein the magnetic core is a multi-segment core in which a first portion of the winding spirals around a first segment in a first flux-generating orientation and a second portion of the winding spirals around a second segment in a second flux-generating orientation opposite to the first flux-generating orientation.

27. The integrated circuit of claim 21, wherein the magnetic core is a multi-segment core in which a first portion of the winding spirals around a first segment in a first flux-generating orientation and a second portion of the winding spirals around a second segment in a second flux-generating orientation opposite to the first flux-generating orientation.

28. The integrated circuit of claim 21, wherein the magnetic core is a multi-segment core in which the winding spirals around a first segment to generate flux is a first path, and second and third segments are provided adjacent to the first segment to provide a return flux path.

29. The integrated circuit of claim 21, wherein the magnetic core is a multi-segment core providing a closed loop for flux, wherein an inductor winding is provided on a segment of the core aligned with an easy axis of core material.

30. The integrated circuit of claim 21, wherein the inductor layer includes at least two inductors.

* * * * *